(12) United States Patent
Venkatraman et al.

(10) Patent No.: US 7,304,874 B2
(45) Date of Patent: Dec. 4, 2007

(54) COMPACT TERNARY AND BINARY CAM BITCELL ARCHITECTURE WITH NO ENCLOSED DIFFUSION AREAS

(75) Inventors: Ramnath Venkatraman, San Jose, CA (US); Ruggero Castagnetti, Menlo Park, CA (US); Joseph Eugene Glenn, Eden Prairie, MN (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 11/074,913

(22) Filed: Mar. 8, 2005

(65) Prior Publication Data

US 2006/0203530 A1    Sep. 14, 2006

(51) Int. Cl.
*G11C 15/00* (2006.01)
(52) U.S. Cl. .................... 365/49; 365/154
(58) Field of Classification Search ............ 365/49, 365/189, 174, 206, 202, 190; 711/171–173; 254/202
See application file for complete search history.

(56) References Cited

U.S. PATENT DOCUMENTS

| | | | |
|---|---|---|---|
| 6,236,585 B1 * | 5/2001 | Hill | 365/49 |
| 6,400,592 B1 * | 6/2002 | Peterson | 365/49 |
| 6,522,563 B2 | 2/2003 | Tanaka et al. | 365/49 |
| 6,563,727 B1 * | 5/2003 | Roth et al. | 365/49 |
| 6,678,174 B2 * | 1/2004 | Suzui et al. | 363/55 |
| 6,834,003 B2 * | 12/2004 | Towler et al. | 365/49 |
| 6,842,360 B1 * | 1/2005 | Srinivasan | 365/49 |
| 6,900,999 B1 * | 5/2005 | Yen et al. | 365/49 |
| 7,009,862 B2 * | 3/2006 | Higeta et al. | 365/49 |
| 2004/0100810 A1 * | 5/2004 | Towler et al. | 365/49 |
| 2004/0223353 A1 * | 11/2004 | Kim et al. | 365/49 |

* cited by examiner

*Primary Examiner*—Son Dinh
*Assistant Examiner*—Douglas S. King
(74) *Attorney, Agent, or Firm*—Yee & Associates

(57) ABSTRACT

Improved layouts of binary and ternary content addressable memory cells (BCAM and TCAM) are shown. A content addressable memory cell layout has a plurality of P+ diffusion areas and a plurality of N+ diffusion areas that do not enclose isolation regions and on which shallow trench isolation stress can exert minimal influence on the drive current of the memories. Further, all transistors in the content addressable memory cell layout are oriented in the same direction to avoid unintended variations in electrical performance. The CAM layouts are "process friendly" to accommodate requirements of advanced process technologies such as the 90 nm process.

16 Claims, 14 Drawing Sheets

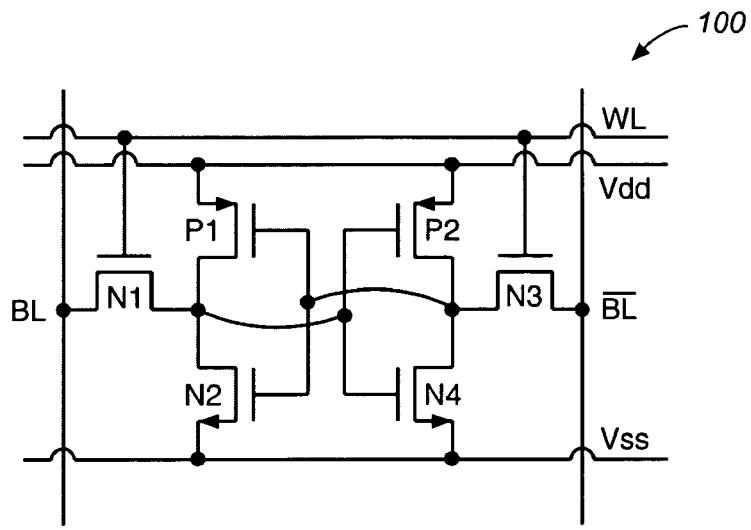
FIG._1 (PRIOR ART)
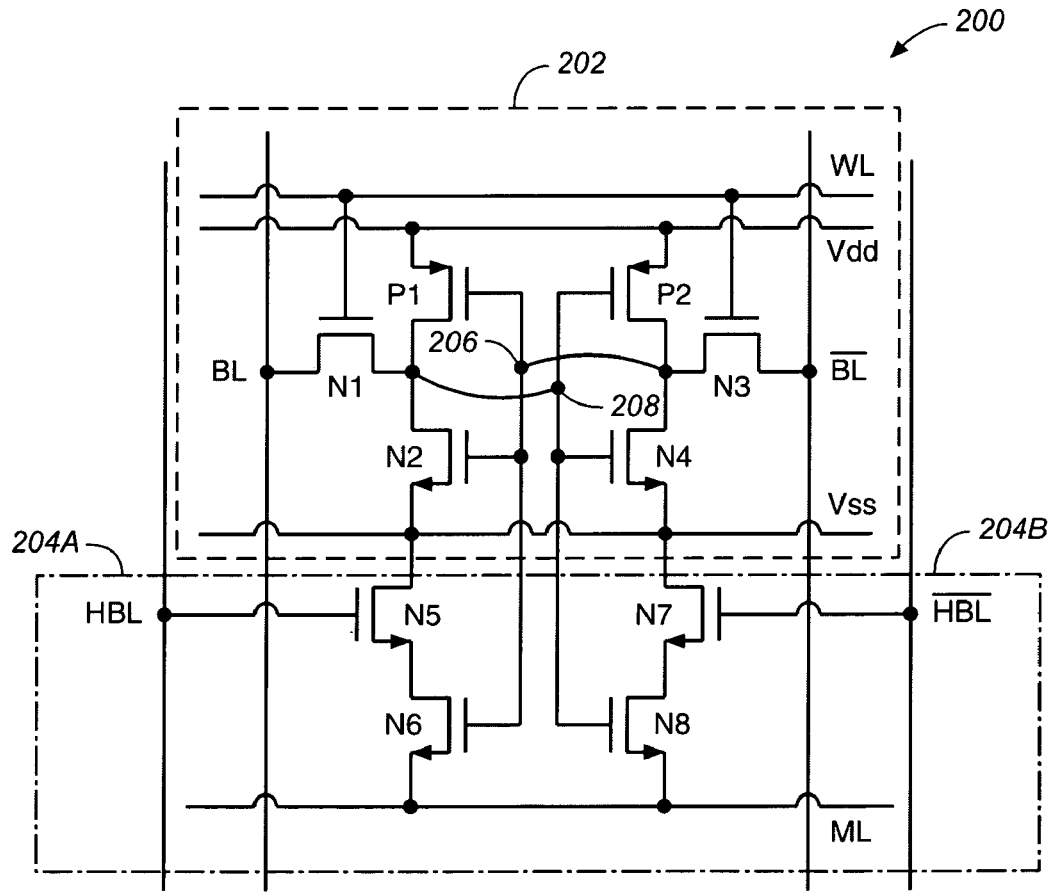
FIG._2 (PRIOR ART)

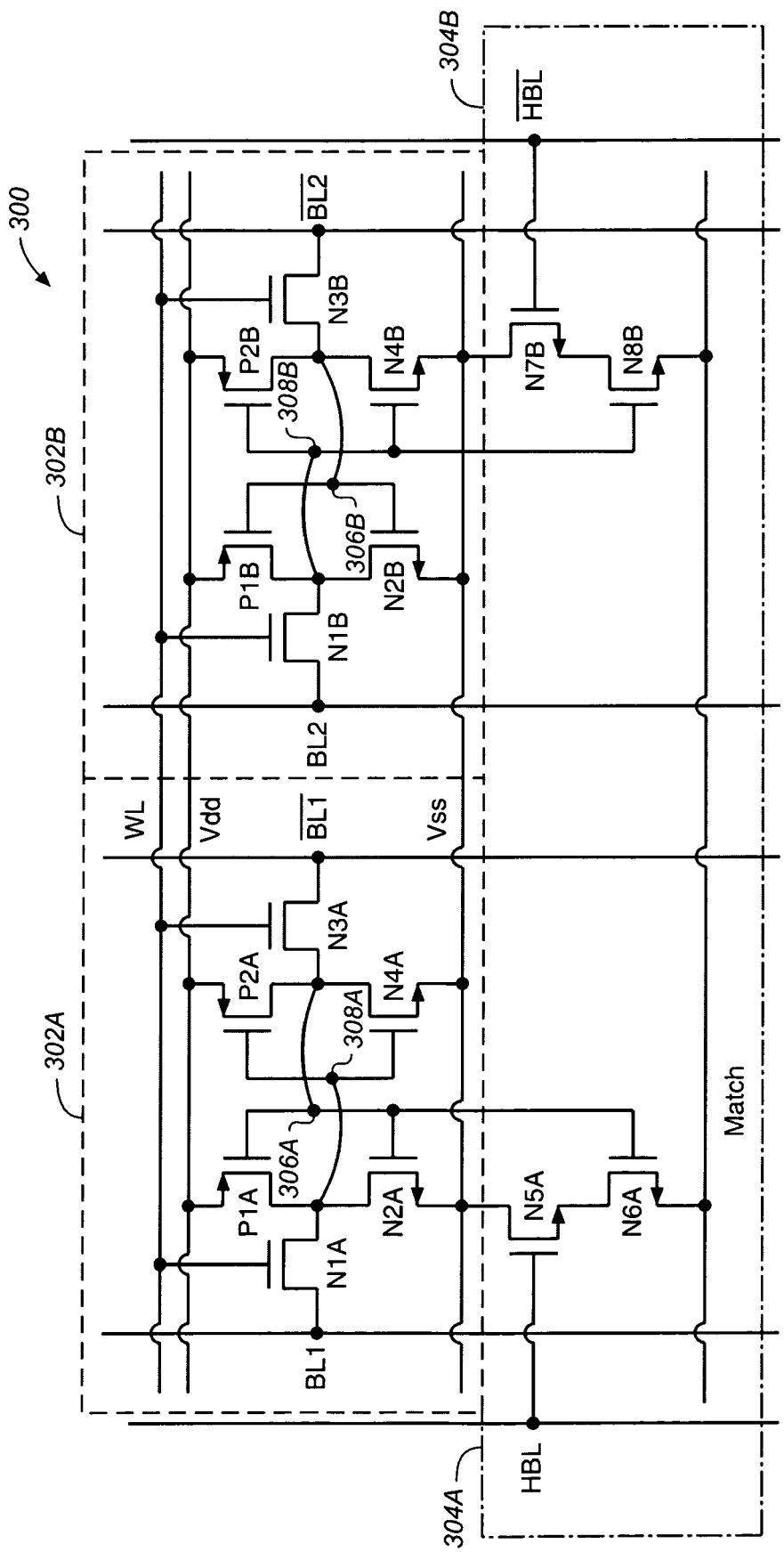
FIG._3 (PRIOR ART)

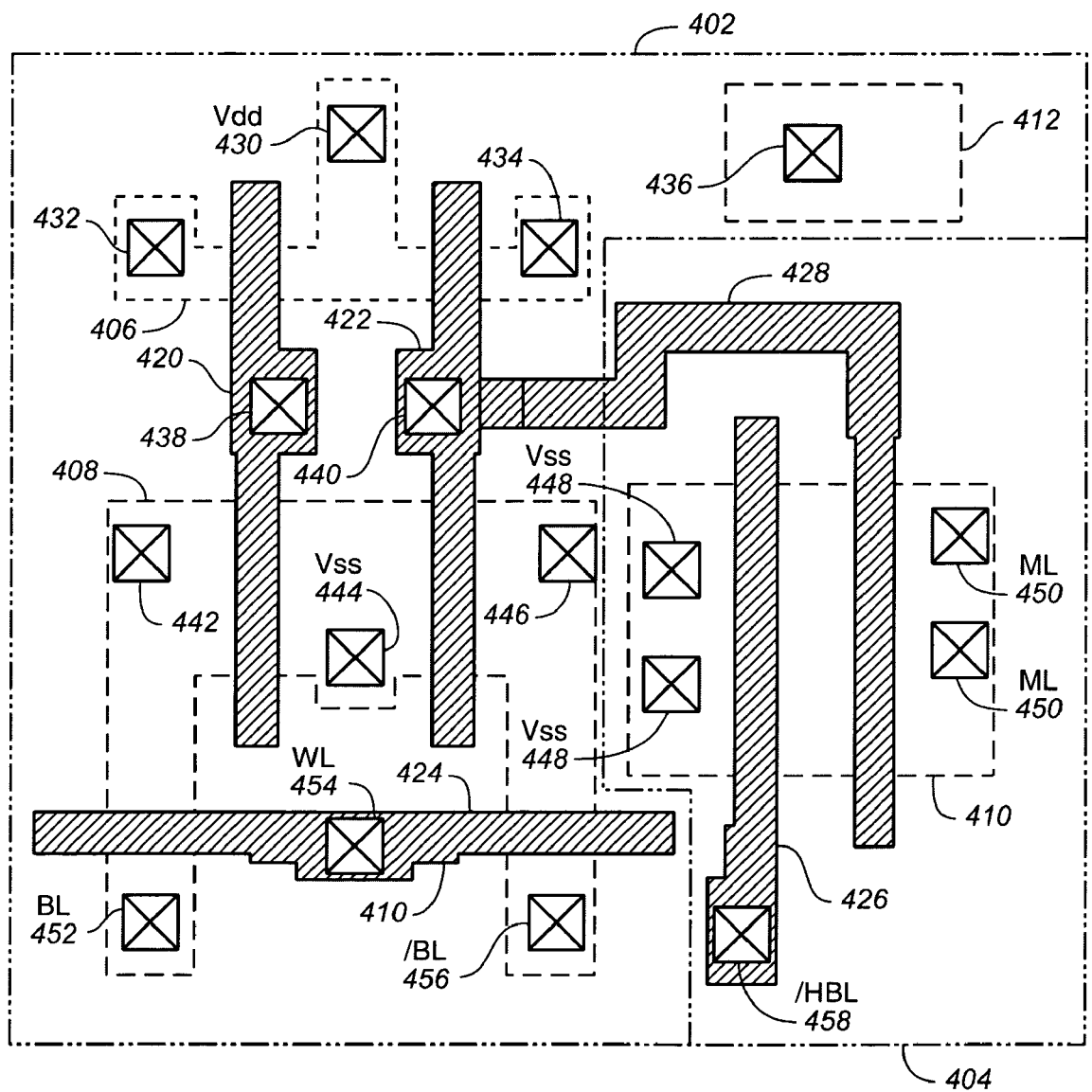
FIG._4A (PRIOR ART)

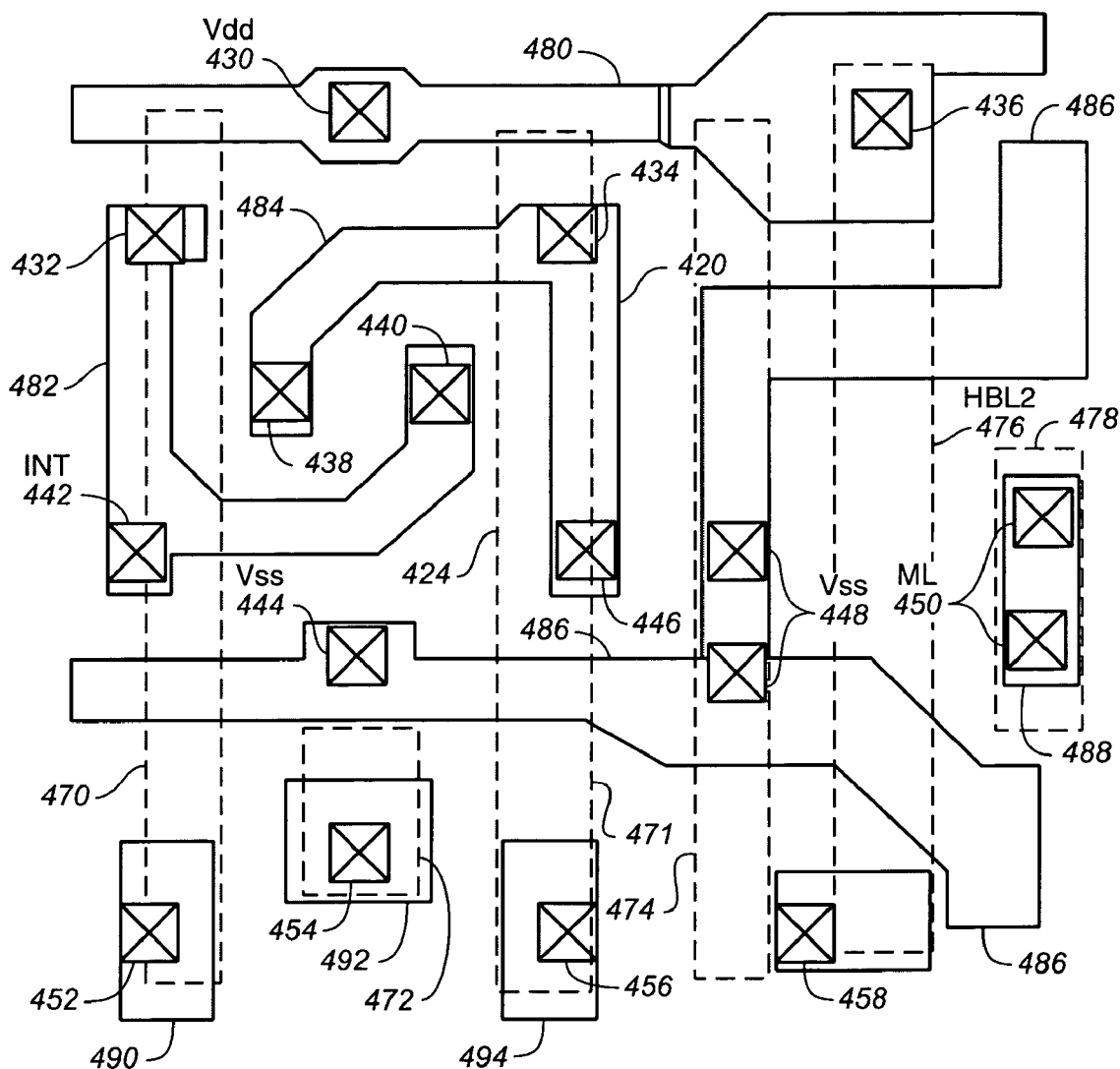
FIG._4B (PRIOR ART)

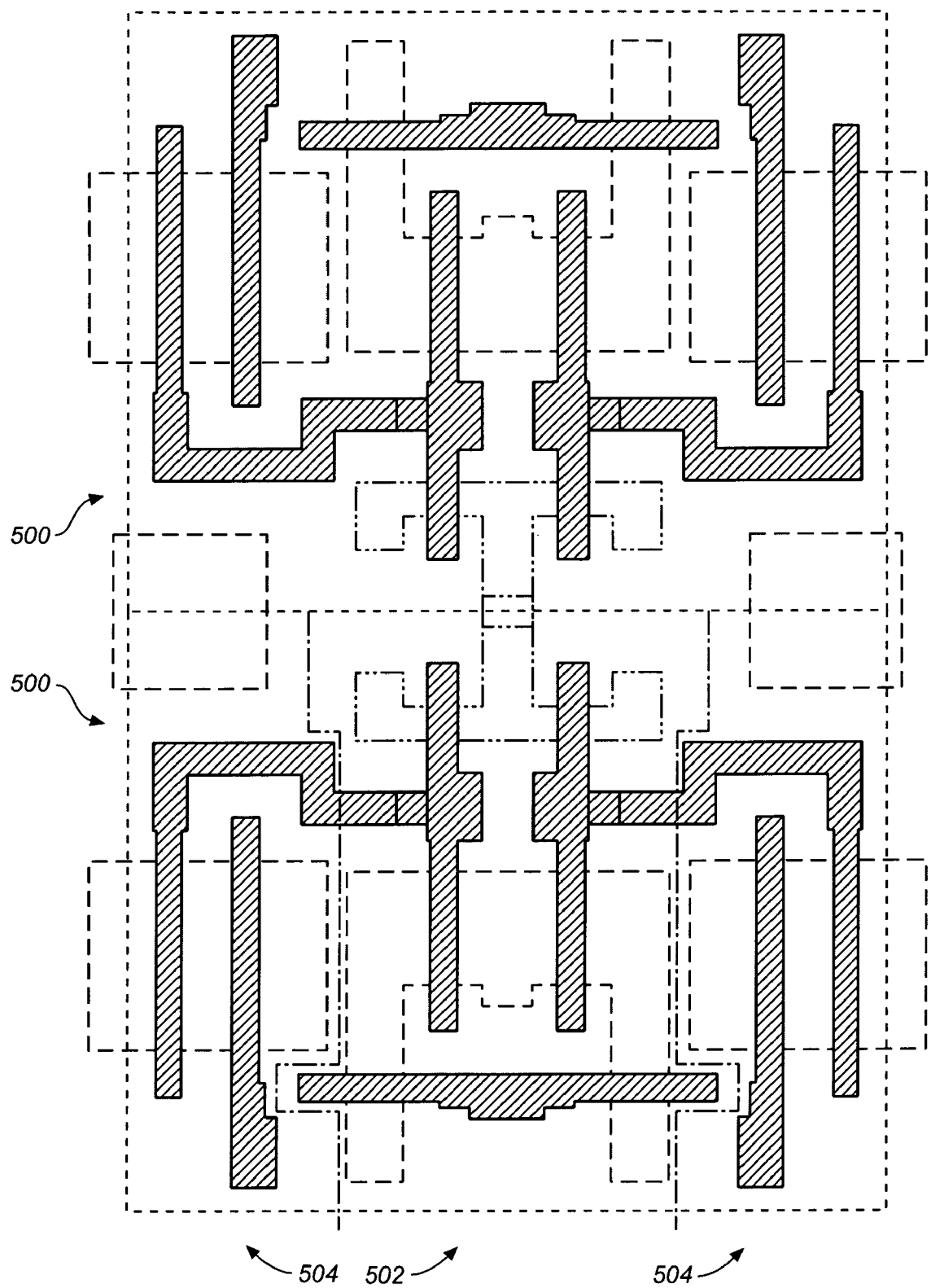
FIG._5A *(PRIOR ART)*

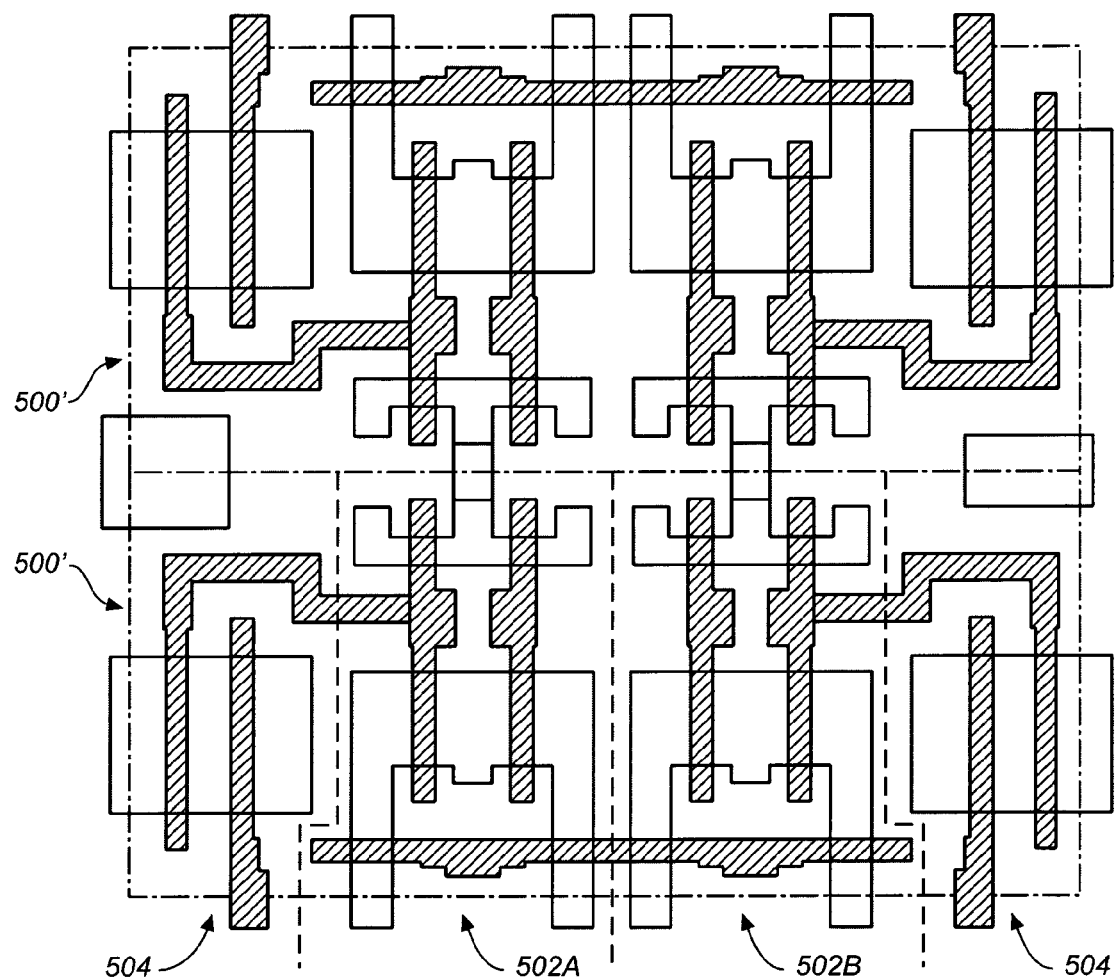
FIG._5B *(PRIOR ART)*

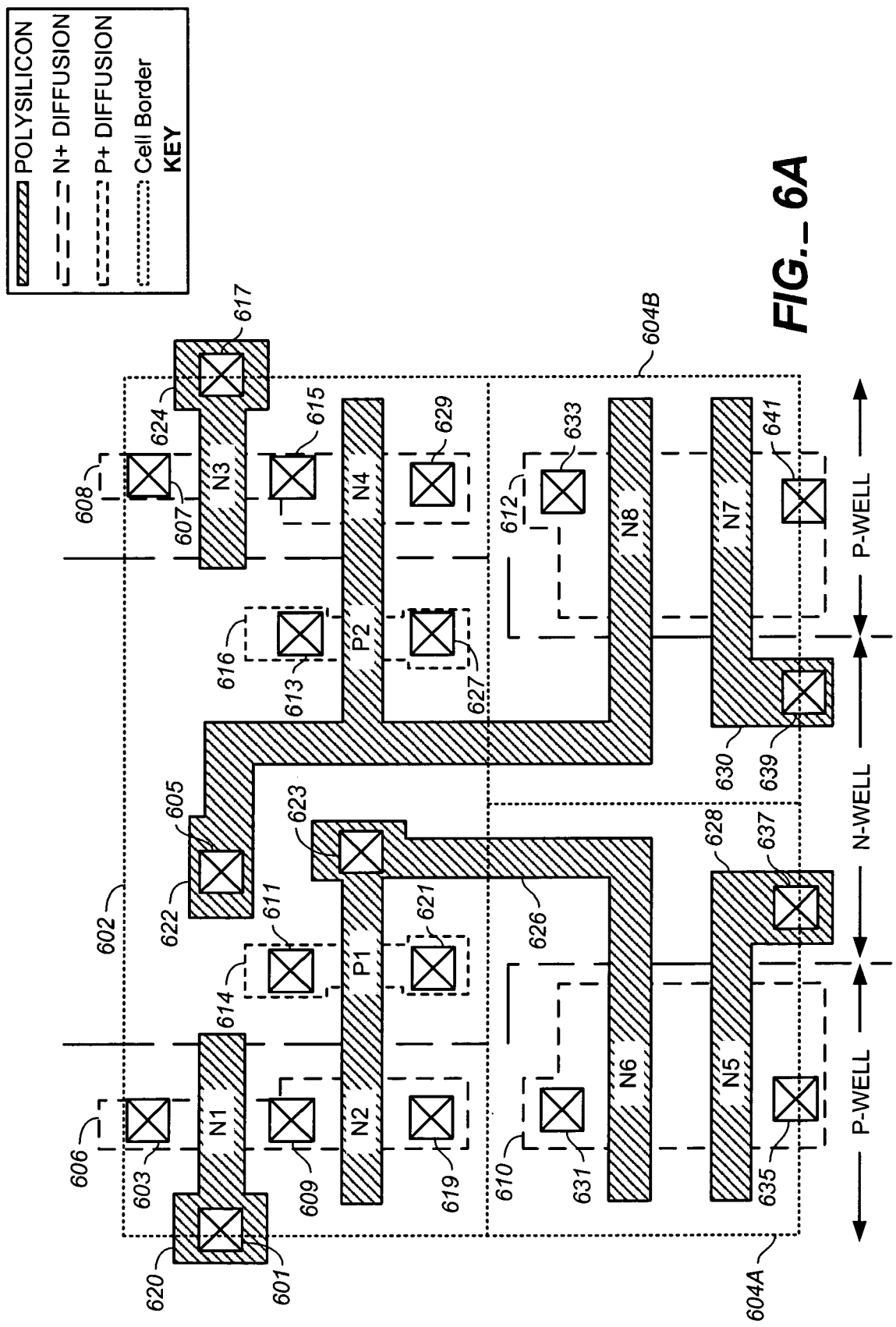
FIG._6A

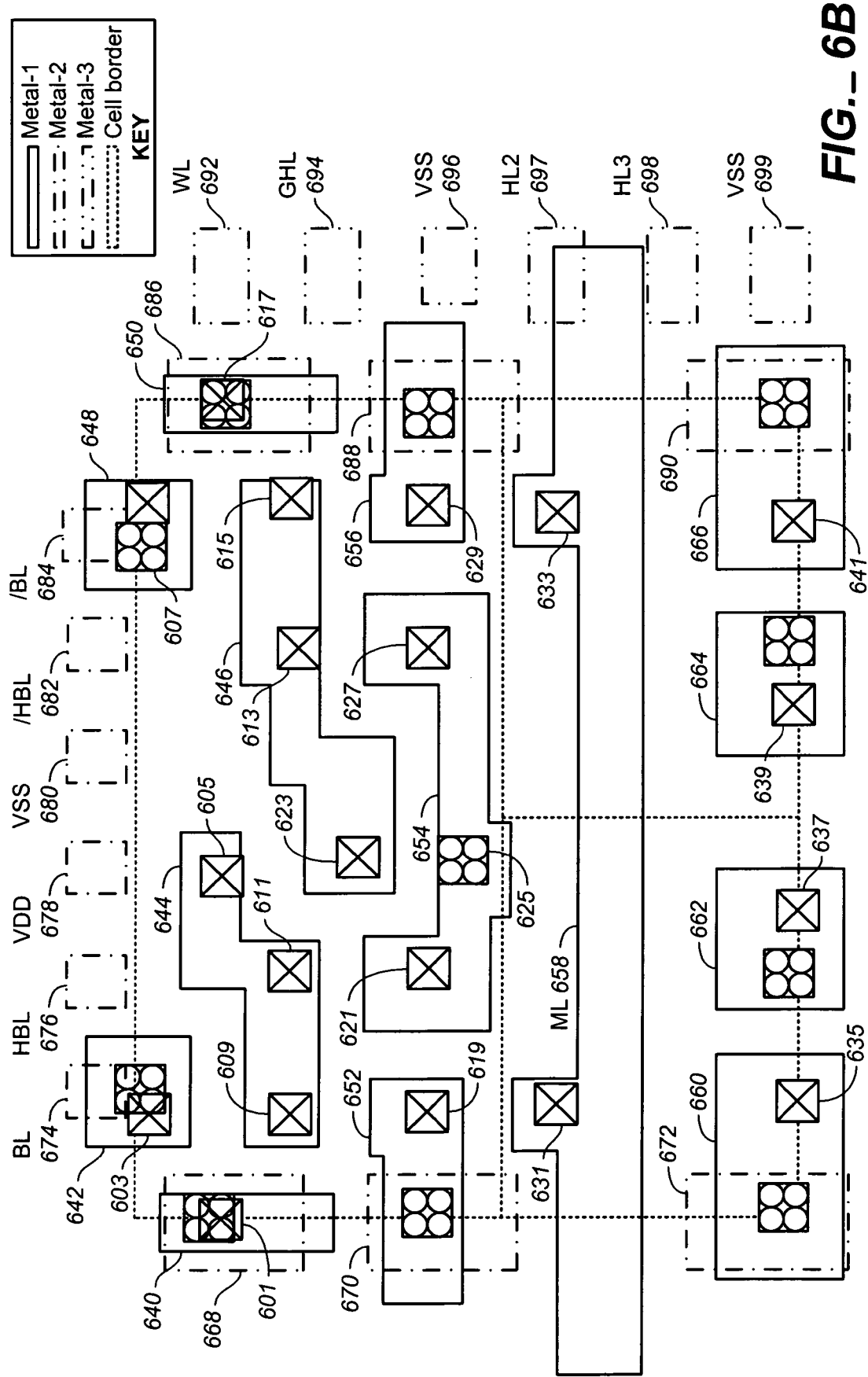
FIG._6B

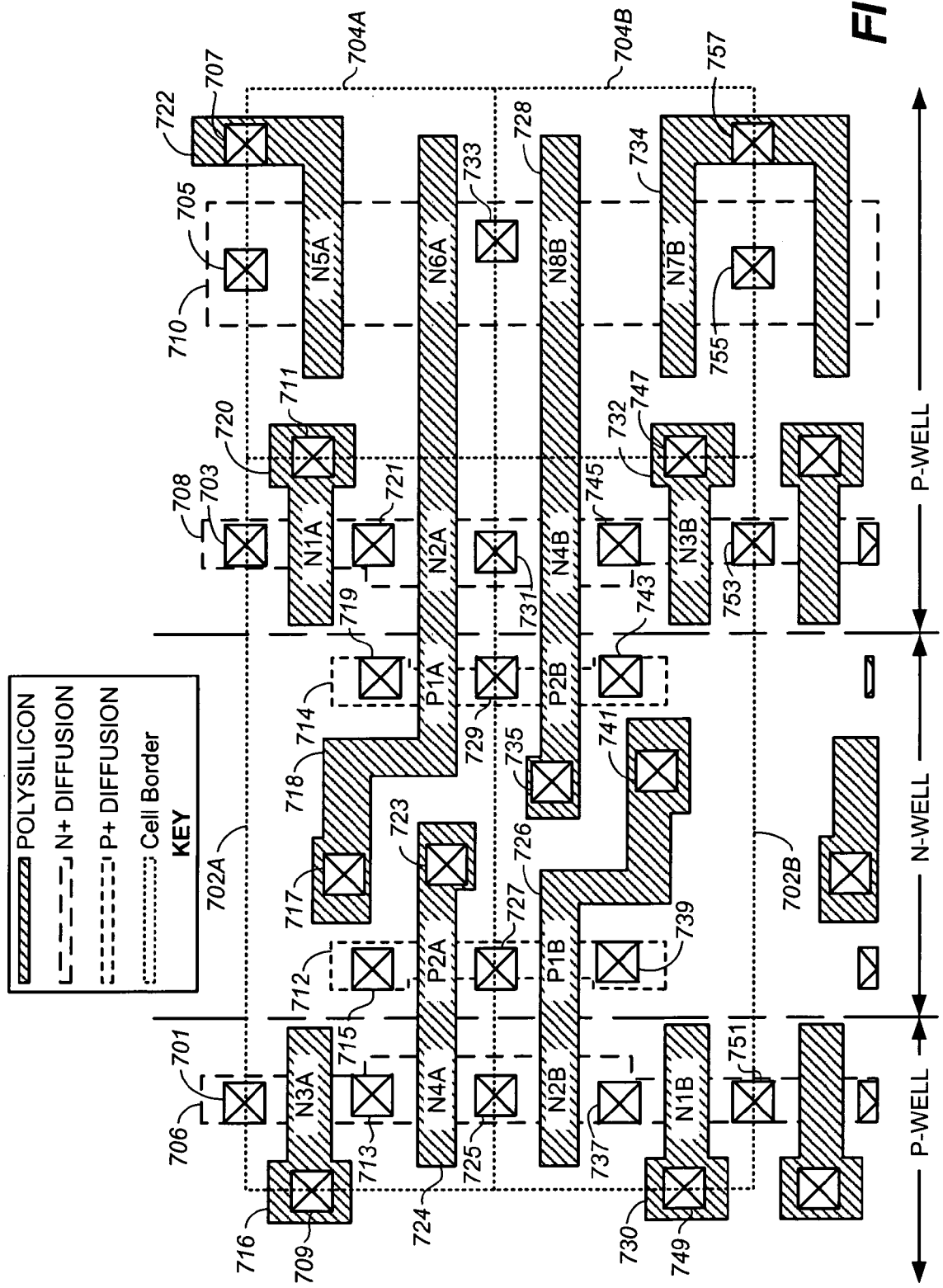
FIG._7A

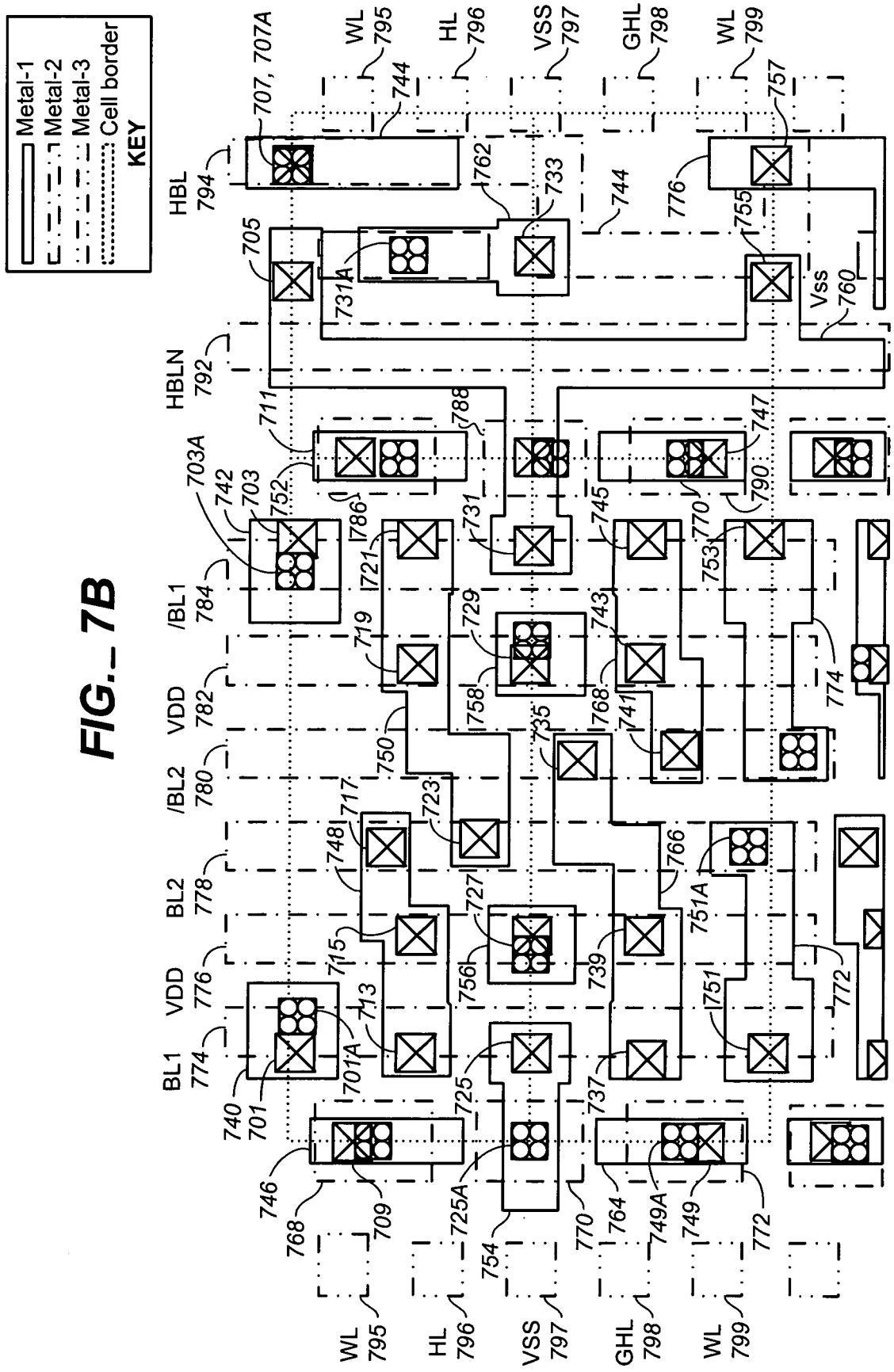
FIG._7B

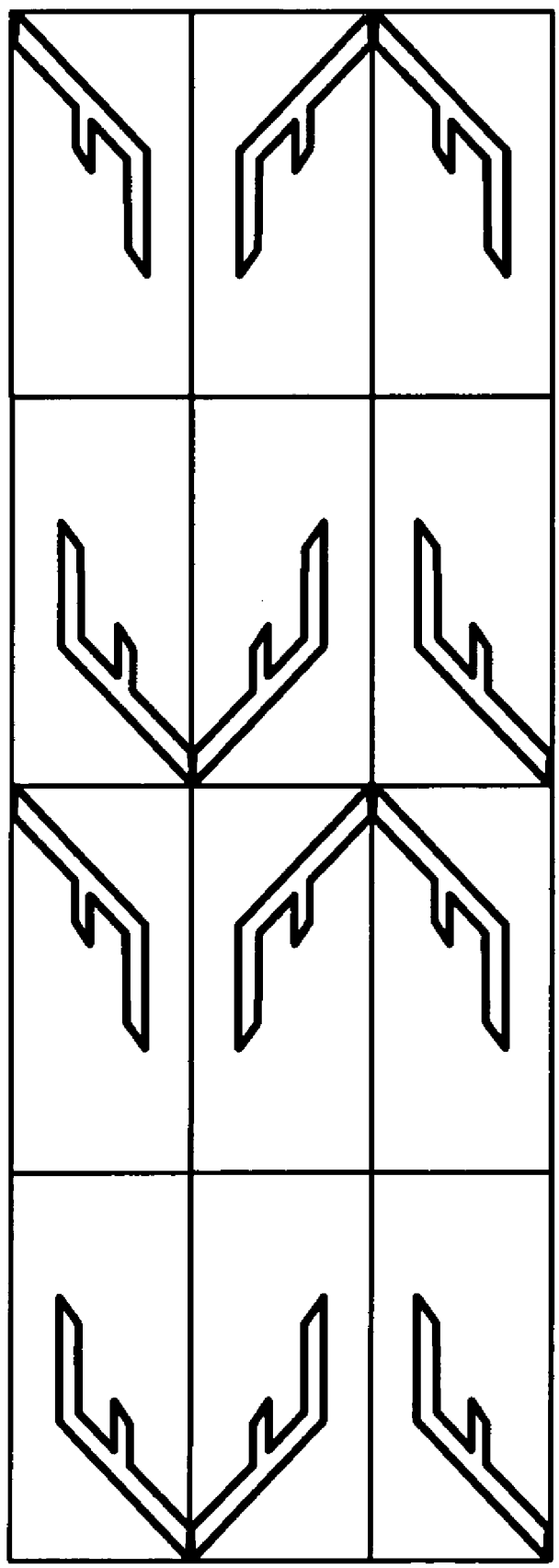
FIG._8A

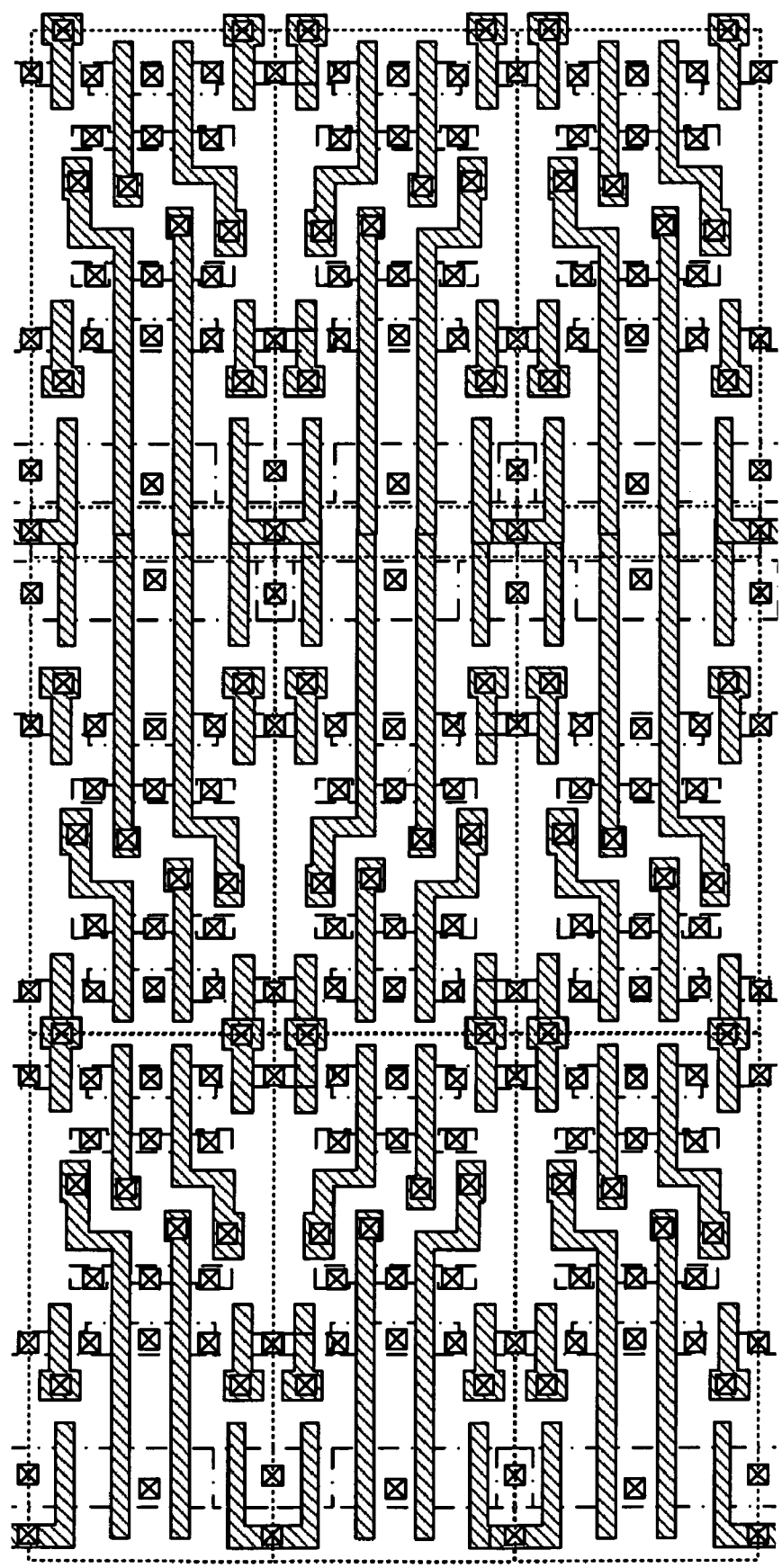
FIG._8B

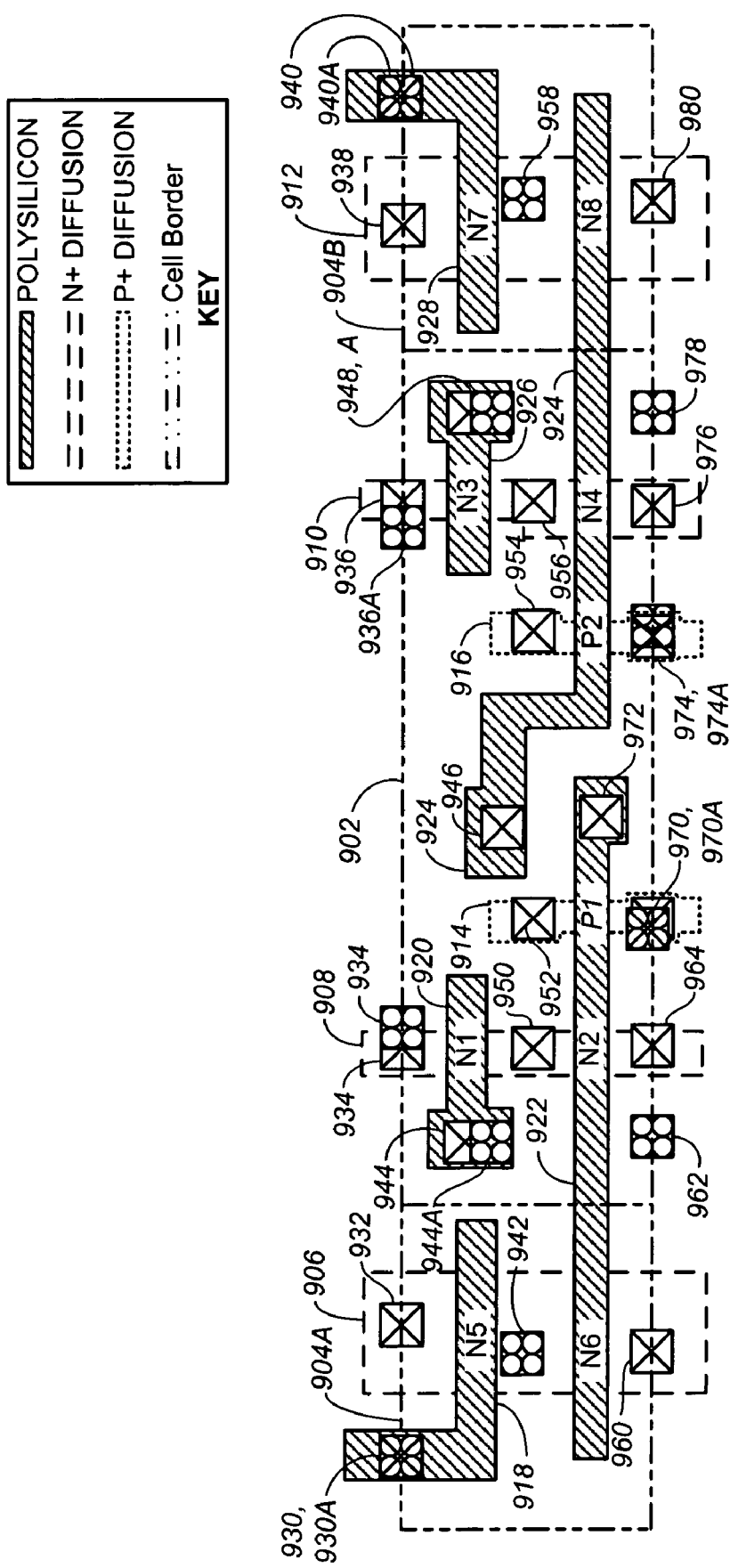
FIG._9A

COMPACT TERNARY AND BINARY CAM BITCELL ARCHITECTURE WITH NO ENCLOSED DIFFUSION AREAS

BACKGROUND OF THE INVENTION

1. Technical Field

The present invention relates generally to the data processing field and, more particularly, to layouts of ternary and binary content addressable memory cells for a data processing system.

2. Description of the Related Art

Content addressable memory (CAM) is a specialized type of memory. Unlike random access memory (RAM), where one uses a given address to randomly access the data stored there, CAM has the capability to supply an address, based on the value stored at or associated with the address. Additionally, an array of CAM cells will have built-in comparison circuitry for every cell of hardware memory. This allows a massively parallel search, where every bit in memory is searched simultaneously. Consequently, the hardware can provide an extremely fast search of a large set of information.

This makes CAMs suitable for applications where fast searches are required, such as imaging, voice recognition, and networking applications. In networking applications, for instance, CAMs are used to control the traffic of packets on the Internet and make sure that the proper information arrives at its destination as specified in the header (e.g. an URL or email address). In many network systems, standalone CAM products are used, which then interface, for example, with an application specific integrated circuit (ASIC) to provide the proper function. However, in order to reduce system cost, power consumption and improve performance, there is a desire to embed CAM functionality within an ASIC as a system-on-chip solution. Therefore, there is a strong need to develop high-density, high-performance CAM bitcells. Present layouts do not meet this need, for reasons that will be discussed.

Short Lesson in CAM Circuitry

CAMs are typically derived from a high-density 6T-SRAM (static random-access memory) bitcell, so an understanding of the circuitry of a bitcell can aid in understanding the complexities of a CAM array. FIG. 1 discloses a circuit diagram of a 6T-SRAM bitcell 100. The bitcell 100 consists of two PMOS (positive-channel metal-oxide semiconductor) transistors P1, P2, four NMOS (negative-channel metal-oxide semiconductor) transistors N1, N2, N3, N4, two bitlines BL, /BL for signal detection, one wordline WL used for reading and writing data to the cell, and the power supplies Vdd, Vss. Bitlines BL, /BL (read as bar BL) carry complementary values, i.e., one is high and one is low, when the cell is written. After writing, the cell will contain a single bit of information, e.g., if it was written with BL=low, /BL=high, the cell will have a value of zero while if it was written with BL=high, /BL=low, the cell will have a value of one. The data is stored through two, cross-coupled inverters, with this configuration allowing the information to be maintained without the need for constantly refreshing, as is the case in DRAM (dynamic random-access memory). Although other bitcell circuits have been proposed and used, the 6T-SRAM cell shown is the one most commonly used in the industry for memory, especially for high-density applications.

Two types of CAM bitcells can be formed from this 6T SRAM bitcell: binary and ternary, which will be explained along with their structures. FIG. 2 discloses a binary CAM (BCAM) bitcell 200. BCAM bitcell 200 will not only store the bit of information in the SRAM structure above, here denoted 202, but also contains two complementary hitlines HBL, /HBL that provide the data for comparison, comparison circuit 204, composed of four additional NMOS transistors N5, N6, N7, N8 that compare the cell data to the hitlines HBL, /HBL, and a matchline ML that indicates if there is a match or not. Because the bitcell, like the SRAM cell above, can have a value of only zero or one, a comparison between the value carried in the bitcell and the value carried in the hitlines can only result in two answers: match or no-match.

More recently, ternary CAM (TCAM) bitcells have been developed that can provide an additional option, a "Don't care" value. To add this extra possible choice, a TCAM bitcell contains two 6T-SRAM portions and their respective programming circuits, although no additional hitlines are added. FIG. 3 discloses a TCAM bitcell 300. Bitcell 300 contains two 6T-SRAM bitcells 302A, 302B, but only one comparison circuit 304 and associated hitlines HBL, /HBL. Table 1 below shows the possible values for BCAM cells, while Table 2 shows possible values for TCAM cells.

TABLE 1

| BCAM | | |
| --- | --- | --- |
| BL | /BL | Cell Value |
| 0 | 1 | 0 |
| 1 | 0 | 1 |

TABLE 2

| TCAM | | | | |
| --- | --- | --- | --- | --- |
| BL1 | /BL1 | BL2 | /BL2 | Cell Value |
| 0 | 1 | 0 | 1 | 0 |
| 0 | 1 | 1 | 0 | Don't care |
| 1 | 0 | 0 | 1 | Not used |
| 1 | 0 | 1 | 0 | 1 |

As discussed previously, a binary CAM has only two values and will either match or not match against the hitlines. In the ternary CAM, there are four possible combinations of values shown by the bitline, although one of the possible values, with both BL1 and /BL2 high, is not used. When both BL1 and /BL2 are low, this signals a "don't care" value, which will show as a match against any value. This allows some portions of a pattern to be ignored while other portions are compared.

Problems Encountered in Designing CAM Layouts

Due to the increasing use of large CAM memories in System-on-Chip (SoC), it is necessary that a high density of such memories be achieved while still delivering the highest possible performance. The proper design of unit binary or ternary CAM bitcells is, therefore, of great importance in order to optimize chip density and performance.

In addition, with the advent of more advanced process technologies, such as the 90 nanometer (nm) process, the yield and performance of CAMs are much more sensitive to process-layout interactions as compared to previous technologies. For example, it is known that mechanical stresses that are induced in shallow trench isolation (STI) directly impact the performance of transistors due to the transfer of these stresses to the metal-oxide semiconductor (MOS)

channel region. The negative effect of stress on transistor performance is directly dependent on the distance between the STI edge and the transistor. SRAM cells, owing to tighter design rules, are generally more affected by such process-layout interactions. In order to be used in advanced process technologies such as the 90-nm process, the layouts of binary and ternary CAM cells need to be such that these process-layout interaction effects are minimized Also, advanced process technologies, such as the 90-nm process, offer more choices for threshold voltages (Vt) of transistors compared to older technologies. For 6T SRAM cells, a high NMOS and PMOS Vt is typically chosen to achieve a high static noise margin (SNM); and, at the same time, to achieve low leakage and adequate write-margins. For example, a low NMOS Vt within a cell will lower the SNM of the cell creating problems with reliable storage of the memory bit (to offset this a higher beta ratio must be used, increasing the cell size). On the other hand, a low PMOS Vt within a 6T cell will lower the write margin, while somewhat increasing the SNM. Keeping these factors in mind, it is a generally accepted practice to maintain the $V_t$ in the devices within a 6T cell high. However, within a CAM cell, the transistors responsible for the match operation do not directly influence the storage stability or the read/write performance of the memory cell. These transistors can therefore have their threshold voltages set separately from the 6T-SRAM transistors in order to deliver desired performance and leakage targets. It is desirable that the layout of the CAM cell will allow this separate threshold voltage setting.

Prior Art Solutions

In order to use similar layouts for both binary and ternary CAM cells, current implementations generally make use of a symmetric 6T-SRAM-layout architecture. This allows comparison circuit 204 to be easily connected to either a single 6T-SRAM bitcell to create a binary CAM or to two 6T-SRAM bitcells to make a ternary CAM. FIGS. 4A and 4B show a prior art layout for 6T-SRAM bitcell 100 and for half of a comparison circuit, such as the right half of circuit 204. FIG. 4A shows the symmetric active areas and polysilicon lines for the 6T SRAM 402 and the comparison circuit 404, which is connected to the true internal node. FIG. 4B shows the metal-1 and metal-2 layers for the same device layouts. In FIG. 4A, 6T-SRAM cell 402 is composed of P-type diffusion regions 406, N-type diffusion regions 408, 412, and polysilicon gate lines 420, 422, and 424. N-type diffusion region 412 is used for the NWELL connection. Furthermore, comparison circuit 404 contains N-type diffusion regions 410 and polysilicon gate lines 426 and 428. Contacts 430-458 from the gates and/or diffusion areas to metal 1 are also shown. FIG. 4B discloses the metal-1 layer, which includes segments 480-494 and the metal-2 layer, which includes segments 470-478; it additionally repeats contacts 430-458 to help provide reference between the two drawings. Here, metal 1 segment 480 is used for Vdd power connection and segment 486 is used for $V_{ss}$ connection. Furthermore, metal 1 segment 482 represents internal node 208 and segment 484 represents node 206 of the 6T-SRAM cell. Metal 2 segments 470 and 471 represent the bitlines of the 6T-SRAM cell, while segment 476 represents one of the hitlines of comparison circuit 304 in FIG. 3. Comparing FIG. 4A to the circuit of FIG. 3, gate lines 420, 422 form the gates for transistors P1B, N2B, P2B, N4B, and gate line 424 forms the gates for transistors N1B and N3B. Contacts 438, 440 provide the nodes by which these segments are connected to the internal nodes of the 6T-SRAM cell. Contact 454 connects transistor gates N1B and N3B to the wordline. Contact 452 connects to bitline 470 (BL or BL2), while contact 456 connects to the associated (complementary) bitline 471 (/BL or /BL2). Contact 430 provides a connection to Vdd, which is carried in metal-1 segment 480, while contacts 444, 448 make the connection to Vss metal-1 segment 486. Metal-1 segment 482 ties contacts 432, 440, 442 together to form one of the internal nodes, while segment 420 similarly ties contacts 434, 438, 446 together in another internal node. Within comparison circuit 404, contact 448 is connected to Vss, carried in metal-2 474, and 450 carries matchline ML. Gate lines for transistors N7 and N8 or for N7B and N8B are carried by segment 426, which is connected through contact 458 to /HBL 476, and by gate line 428.

We have discussed how the assembly of building blocks for 6-T SRAM bitcell 402 and comparison circuit 404 forms ternary CAM sub-blocks 302B. Comparing schematics of binary CAM 200 of FIG. 2 with ternary CAM 300 of FIG. 3, it becomes clear to those skilled in the art that each individual portion 302A or 302B can form a binary cell 200 by either adding transistors N7A and N8A to portion 302A, or transistors N5B and N6B to portion 302B. Hence, assembly of building blocks 402 and 404 can be used to make either a binary CAM array or a ternary CAM array, as will be shown in the following figures. Showing only the substrate level and gate lines, FIG. 5A discloses two BCAM bitcells as they would be laid out for an array. Each BCAM bitcell 500 contains one 6-T SRAM bitcell 502 and two comparison circuits 504. FIG. 5B discloses the same layouts used to form two TCAM bitcells as laid out for an array. Here, each TCAM bitcell 500' contains two 6-T SRAM bitcells 502 and two comparison circuits 504.

Among shortcomings of the CAM cell layout illustrated in FIGS. 4A,B and FIGS. 5A, B include the following:

a) Diffusion region 408 can be seen in FIG. 4A to form an inverted "U". In an array, this shape is mirrored into the cell below, while the bitline contact is shared between the cells forming a "donut-shaped" diffusion region. The rectangular region that is enclosed by the diffusion regions contains silicon dioxide for isolation. The structure of an isolation region completely surrounded by a diffusion region leads to stress-related effects that can significantly impact the performance and/or yield of the memory cell. As such, it is typically required that in SRAM cells that have this feature, the enclosed areas must have an area equal or grater than a given value, which can increase the size of the cell.

b) The proximity between diffusion area 408, which forms the n-type transistors for the SRAM bitcell, and diffusion area 410, which forms the n-type transistors for the comparison circuit, is sufficiently small that it is difficult to have different implants in these two areas. Because of this, it is difficult to set the threshold voltages Vt of these devices separately to optimize their different uses.

c) The patterns for polysilicon and for contact/metal 1 are relatively difficult to implement while still achieving a compact cell size. Design rules, such as metal-1 spacing, as well as metal-1 overlap of contacts, determine overall cell size. These rules must be aggressively approached with this conventional device. Because the width of the polysilicon lines in FIG. 4A vary along the length of the line, this design is inherently less conducive to achieving the SPICE modeling targets. The design also results in larger polysilicon end-caps being required.

d) Area-wise, the layout illustrated in FIGS. 4A and 4B results in a larger cell area than is desired.

It should be emphasized that most of the shortcomings listed above become increasingly more important with more advanced technology processes such as the 90 nm process. Therefore, it is important to have "process-friendly" CAM cell layouts that specifically address issues posed by process-layout interactions; and, at the same time, that deliver aggressive memory area densities.

U.S. Pat. No. 6,522,563 describes a method for achieving a more compact CAM cell layout. However, the described approach changes the design of the CAM cell at the transistor level by using p-channel transistors as access transistors to the SRAM cells to improve the efficiency of layout of the cell array. The use of p-channel transistors as access transistors greatly reduces the performance of the SRAM cell (for a given size of transistor used) because PMOS devices inherently have lower channel mobility than NMOS devices.

There is, accordingly, a need for an improved layout of binary and ternary CAM cells that achieves a more compact cell layout without altering the transistor schematics of the CAM cells, and that is "process friendly" to accommodate requirements of advanced process technologies such as the 90 nm process.

SUMMARY OF THE INVENTION

The present invention provides layouts of binary and ternary content addressable memory cells. A content addressable memory cell layout according to the invention contains no isolation regions that are surrounded by diffusion regions. Rather, the diffusion regions are designed such that shallow trench isolation stress can exert only minimal influence on the drive current of the memories. The content addressable memory cell layout according to the invention further has transistors that are all oriented in the same direction to avoid unintended variations in electrical performance and can have multiple threshold voltages set for n-type transistors within the same cell. Content addressable memory cell layouts according to the invention are "process friendly" to accommodate requirements of advanced process technologies such as the 90 nm process.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 shows a circuit diagram for a known 6-T SRAM bitcell.

FIG. 2 shows a circuit diagram for a known BCAM bitcell.

FIG. 3 shows a circuit diagram for a known TCAM bitcell.

FIG. 4A shows the substrate and polysilicon levels and FIG. 4B shows the metal-1 and metal-2 levels of a layout design for a known 6-T SRAM bitcell and comparison circuit for a CAM cell.

FIG. 5A shows the substrate and polysilicon levels of two bitcells of a known BCAM array.

FIG. 5B shows the substrate and polysilicon levels of two bitcells of a known TCAM array.

FIGS. 6A and 6B schematically illustrate a layout of a BCAM cell according to an exemplary embodiment of the invention;

FIGS. 7A and 7B schematically illustrate a layout of a TCAM cell in accordance with a preferred embodiment of the present invention; and FIG. 8A is a diagram that illustrates a scheme by which the illustrative ternary CAM cells of FIGS. 7A,B can be arranged into an array, according to an illustrative embodiment of the invention.

FIG. 8B schematically illustrates an actual array of nine TCAM cells, showing only the substrate and gate levels.

DETAILED DESCRIPTION

Figure 9B:
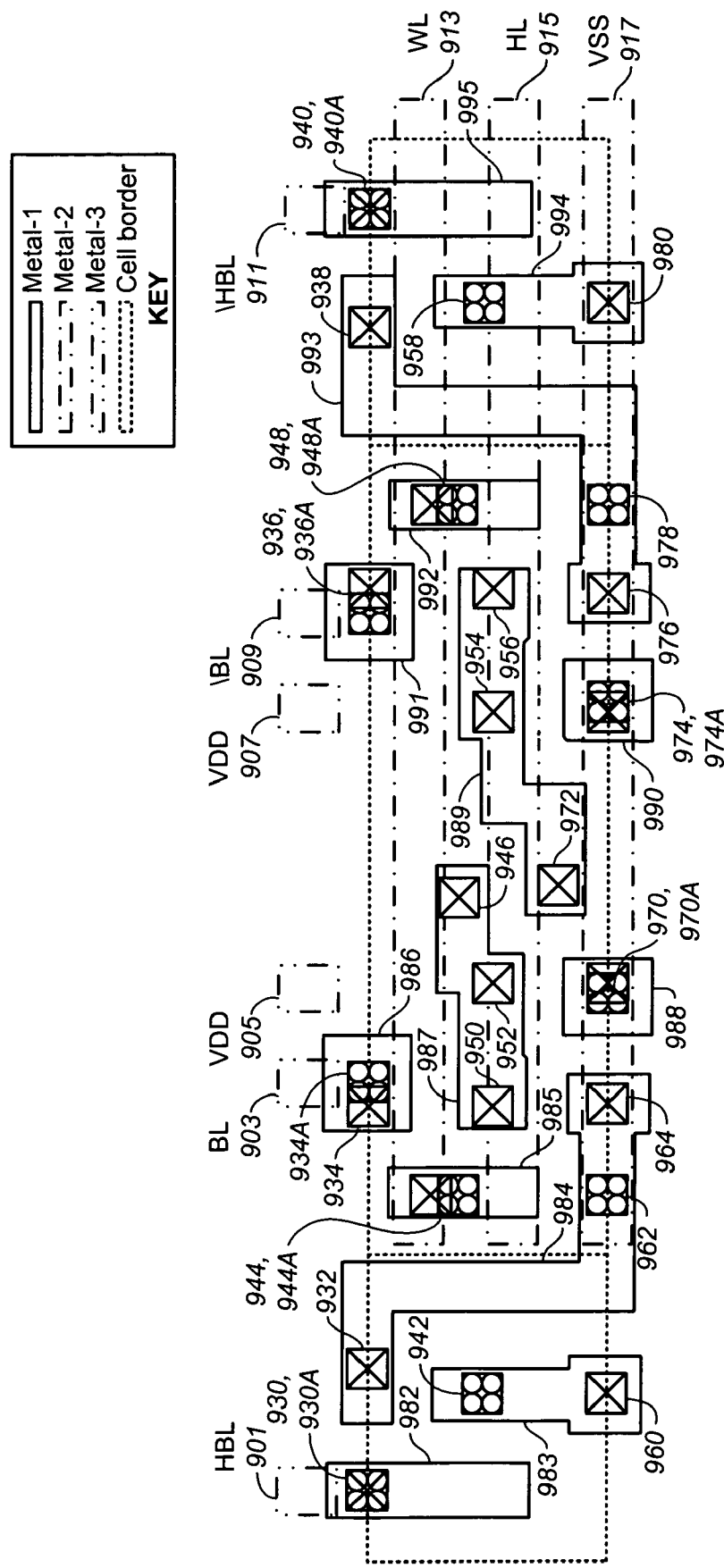
FIGS. 9A,B illustrate a binary CAM cell that can be derived from the ternary CAM cell of FIG. 7, but which is less desirable than the binary cell of FIG. 6.

The invention will now be discussed with regard to several specific embodiments, shown in FIGS. 6A, B and 7A, B.

Binary CAM Layout

A binary CAM (BCAM) layout is shown in FIGS. 6A and 6B, with FIG. 6A showing the diffusion regions and gate lines and FIG. 6B demonstrating the metal-1, metal-2, and metal-3 layers. For reference between the two drawings, the contacts to the substrate are shown in both drawings. Additionally, each cell is divided by dotted lines into the 6T-SRAM 602 and comparison cells 604A, 604B. With reference first to FIG. 6A, shown are n-type diffusion regions 606, 608, 610, 612 and p-type diffusion regions 614, 616. There are six separate polysilicon gate lines 620, 622, 624, 626, 628, 630. Of these, gate line 620 forms the gate of transistor N1; gate line 622 forms the gate of transistors P2, N4, and N8; gate line 624 forms the gate of transistor N3; gate line 626 forms the gate line of transistors N2, P1, and N6; gate line 628 forms the gate of transistor N5; and gate line 630 forms the gate of transistor N7.

Turning to FIG. 6B, the metal-1 layer is composed of segments 640-666 (even reference numbers only), which generally provide connections between lines carried in higher levels and the substrate and also connect different nodes of the substrate. Metal-2 lines are shown across the top of the figure and generally extend vertically through the cell, while metal-3 lines, although they also extend horizontally across the cell, are shown only at the edges of the drawing to avoid too much clutter. Metal-1 segments 642, 648 receive vias 603A, 607A from the bitlines metal-2 lines BL 674, /BL 684, and in turn extend contacts 603, 607 to the substrate for BL, /BL. Segments 640, 650 both receive vias 601A, 617A from metal-3 wordline WL 692 through metal-2 segments 668, 686 and extend contacts 601, 617 to the substrate surface. Segment 644 ties together contacts 605, 609, 611 and forms node 208 from FIG. 2; segment 646 ties together contacts 613, 615, 623 and forms node 206 from FIG. 2. Segments 652, 656 receive vias 619A, 629A from Vss 696 through metal-2 segments 670, 688 and provide contacts 619, 639 to the substrate. Note that Vss 680 provides this voltage in the vertical direction also, a common and necessary feature of this type of cell. Segment 654 receives via 625 from Vdd 678 and carries this voltage to the substrate at contacts 621, 627; segment 658 is the matchline ML, which is completely carried in metal-1 and contacts the substrate at contacts 631, 633. Finally, segments 660, 666 receive vias 635A, 641A from metal-3 Vss 699 through metal-2 segment 672, 690 and carry it to the substrate at contacts 635, 641, while segments 662, 664 receive vias from HBL 676 and /HBL 682 and contact the substrate at contacts 637, 639. Notably, contacts 601, 603, 607, 617, 635, 637, 639, and 641 and vias 619A, 629A, which are on the boundary of the cell, are shared with the adjacent cell. In addition to the input lines that were shown in FIG. 2, this layout also includes a global hit line GHL 694 and two additional hit lines HL2 697, HL3 698.

Some of the advantages of the disclosed binary CAM cell layout include:

a) The diffusion regions do not form enclosed areas, avoiding the problems this entails.

b) All transistors are formed in the same direction; e.g., all polysilicon gate lines run horizontally over the diffusion regions and all channels run vertically in the figures. This is advantageous because during photolithography there can be a systematic difference introduced in the critical dimensions between transistors that are perpendicular to each other, which can lead to unintended variations in electrical performance. Note that the prior-art cell of FIG. 4A, the gate that controlled by word line WL 454 is formed in a direction perpendicular to other gate lines in the cell.

c) All of the polysilicon sections are straight (i.e., no jogs) between the N+ and P+ areas, e.g., between N4 and P2 and between P1 and N2. This leads to better critical dimension fidelity in the polysilicon over the active areas and, therefore, more reproducible electrical behavior within the cell.

d) Because the n-type diffusion for the comparison portion of the cell is separated sufficiently from the n-type diffusion of the SRAM bitcell, these regions can receive different implants, so that different thresholds Vt are possible for the comparison and SRAM transistors within the cell.

e) Although not shown in the figures, most SRAM layouts have an N-well region surrounding the p-type transistors and a P-well surrounding the n-type transistors to control leakage. The layout shown allows a continuous N-well running in the vertical direction of the cell. This feature allows for the use of a well tap in a spacer cell introduced periodically, rather than introducing a well tap into each cell (contact 436 in FIG. 4A is an n-well tap within the cell). The feature also provides the capability of independently controlling the well potential with the use of a deep N-well. (In bitcells that have built-in well taps, the taps are often connected to Vdd or Vss within the cell. This prevents independent control of the well voltage.) Similarly, with the use of a deep N-well, the P-well potential within the SRAM array can also be modified to control leakage.

f) In an array of BCAM bitcells according to the invention, as you move in a vertical direction (as aligned in the drawings) down the array, the SRAM portion of a given cell is a rotation of 180 degrees from the SRAM portion of the bitcell immediately above and below that bitcell. Because of this, the equal capacitance loading and environment for bitline pair BL 674, /BL 684 are completely symmetric, since they traverse identical topology.

g) The layout includes a global hit line and 3 additional hit lines. The presence of additional hit lines allows for the design of additional types of CAM architectures, for example, designs where half-word or quarter-word hits can be used.

Ternary CAM Layout

With reference now to FIGS. 7A and 7B, a ternary CAM cell (TCAM) is shown, again with FIG. 7A showing the diffusion regions and polysilicon gate lines and FIG. 7B showing the metal-1, metal-2, and metal-3 layers. Both figures are divided by dotted lines into 6T-SRAM cells 702A, 702B and comparison cells 704A, 704B. Contacts to the substrate are shown in both figures. Looking at FIG. 7A, the diffusion regions are shown as n-type diffusion regions 706, 708, 710 and p-type diffusion regions 712, 714. There are ten polysilicon gate lines 716, 718, 720, 722, 724, 726, 728, 730, 732, and 734. Polysilicon line 716 forms the gate for transistor N3A; polysilicon line 718 forms the gate for transistors P1A, N2A and N6A; polysilicon line 720 forms the gate for transistor N1A; polysilicon line 722 forms the gate for transistor N5A; polysilicon line 724 forms the gate for transistors N4A, P2A; polysilicon line 726 forms the gate for transistors N2B, P1B; polysilicon line 728 forms the gate for transistors P2B, N4B, N8B; polysilicon line 730 forms the gate for transistor N1B; polysilicon line 732 forms the gate for transistor N3B; and polysilicon line 734 forms the gate for transistor N7B. Contacts to the substrate include contacts 701-757 (odd reference numbers only); their associated vias share the same reference number, with an 'A' suffix. Looking next at FIG. 7B, the metal-1 layer contains regions 740-766 (even reference numbers only). Metal-2 segments generally run vertically in the diagram and include reference numbers 746-794 (even reference numbers only); metal 2 carries the two pairs of bitlines BL1 774, /BL1 784, BL2 778, /BL2 780, the hitlines HBL 792, /HBL 794, and Vdd 776, 782. Metal-3 lines run generally horizontal in the figure and include reference numbers 795-799 (odd and even numbers); metal-3 carries word lines WL 795, 799 and Vss 797. An additional hitline HL 794 and global hitline GHL 796 are also available in this layout. To lessen the confusion of too many layers shown on top of each other, the metal-3 layer is shown only on the edges of the figure, although these lines actually run all the way across the cell.

Within metal-1, segments 740, 742 receive respective vias 701A, 703A from BL1 774, /BL1 784 and carry their respective voltages to the substrate through contacts 701, 703. Metal-1 segments 746, 752 receive vias 709A, 711A from word line WL 795 through metal-2 segments 768, 786 and carry their respective voltages to polysilicon gate lines 716, 720 through contacts 709, 711 to control the gates of transistors N3A, N1A. Metal-1 segments 754, 760 receive vias 725A, 731A from Vss 797 through metal-2 segments 770, 788 and carry this voltage to the substrate through contacts 725, 731, 705, 755. Note that segment 760 supplies Vss to both the 6T-SRAM portions of the cell, but also to the comparison circuits. Metal-1 segments 756, 758 receive vias 727A, 729A from Vdd 776, 782 respectively and carry this voltage to substrate through contacts 727, 729. Metal-1 segments 764, 770 receive respective vias 749A, 747A from word line 799 through respective metal-2 segments 772, 790 and carry this voltage to polysilicon gate lines 730, 732 respectively to control the gates of N1B, N3B. Metal-1 segment 748 connects contacts 713, 715, 717 to form the internal node represented by 306A in FIG. 3, while metal-1 segment 750 connects contacts 719, 721, 723 to form the internal node represented by 308A. Metal-1 segment 766 connects contacts 735, 737, 739 to form the internal node represented by 308B; segment 768 connects contacts 741, 743, 745 to form the internal node represented by 306B.

When an array of these TCAM cells is laid out, the pattern of cells is represented in FIG. 8A, where each cell is represented by a rectangle containing an 'F' to demonstrate the directionality of the cell. As this figure shows, when moving in a vertical direction, the cells are mirrored along the horizontal axis, while in the horizontal direction, the cells are rotated 180 degrees from the previous cell. This allows for advantageous sharing of contacts that lie on the margins of the cells. FIG. 8B shows the substrate and gate level of an array of nine TCAM cells according to an illustrative embodiment of the invention.

Some of the advantages of the TCAM cell layout shown herein are the following:

a) There are no enclosed diffusion areas. The n-diffusions 706, 708 for the 6T portions are continuous in the vertical direction, both within the cell and in the SRAM array as a whole. As mentioned previously, the continuous diffusion areas provide the advantage of having no edges where the STI stress can exert an influence on the drive current of the devices. Continuous diffusion is also "friendly" from a photolithographic point of view, as only one dimension is critical in patterning the diffusions. Although the p-diffusion regions 712, 714 within the 6T portion are discontinuous, this is not of concern inasmuch as only the NMOS devices determine the cell current and hence the read and write performance of the cell.

b) The comparison portions 704A, 704B of the cell contain a continuous n-diffusion area 710 that has no jogs. This is advantageous for patterning the structure. This diffusion region 710 is also reasonably well spaced from the n-diffusions 706, 708 of the 6T portions 702A, 702B. This implies that the diffusion region 710 does not need to be implanted at the same time as the other n-diffusion regions 706, 708, so that comparison transistors N5A, N6A, N7B, N8B can be readily converted to have a threshold voltage that is different from the SRAM transistors, depending on the requirements of current drive and/or current leakage.

c) All transistors in the bitcell are formed in the same direction; the advantages of this were discussed in the BCAM advantages.

d) The polysilicon sections between the N+ and P+ areas of the cell are straight, with no jogs, leading to better critical dimension fidelity in the polysilicon over the active areas and more reproducible electrical behavior.

e) The layout contains a split wordline 795, 799. While this consumes an additional wiring track in the horizontal direction, the split wordline can be used to advantage. For example, the split wordline can be used in a CAM architecture where the 'write' to the two 6T portions can be staggered in time, thus saving power. If this ability is not desired, the split wordline can be tied together within spacer cells that are introduced at regular intervals.

f) The layouts of the two 6T portions 702A and 702B of the cell are rotations of each other. Because of this, the capacitance loading and environment for bitline pair BL1 774, /BL1 784 and for bitline pair BL2 778, /BL2 780 are completely symmetric, since they traverse identical topology, as can be seen in FIGS. 7A, 7B. Using this mirroring, a space saving feature is the staggering of vias 751A, 753A such that they are asymmetrically placed across the cell boundary.

g) As one scans across an array of TCAM bitcells according to this layout, each bitcell is rotated 180 degrees from the preceding bitcell. This concept is shown in FIG. 8, which uses a simple, asymmetric pattern for purposes of clarity; one can also visualize this from the layouts shown in FIGS. 7A, 7B by placing copies of the layout side-by-side. This feature makes the capacitance loading for the two wordlines completely symmetric.

h) The layout contains a continuous N-well running in the vertical direction. As discussed in the BCAM advantages, this provides known advantages.

i) Because the n-type diffusion for the comparison portion of the cell is separated from the n-type diffusion of the SRAM bitcell, these regions can receive different diffusions, so different thresholds Vt are possible for the comparison and SRAM transistors within the cell.

BCAM Derived from TCAM Layout

It is also possible to design a BCAM cell derived from the TCAM design above, as illustrated in FIGS. 9A and 9B. In these drawings, there are four n-type diffusion areas 906, 908, 910, 912 and two p-type diffusion regions 914, 916. Polysilicon lines 918, 920, 922, 924, 926, 928 form the gates for the transistors. Contacts 930-980 (even numbers only) form the contacts for the diffusion regions and the gate lines.

Within the metal-1 layer, segment 982 carries the signal for hitline HBL 901 to polysilicon gate line 918, while segment 995 carries the signal for complementary hitline /HBL 911 to polysilicon gate line 928. Segment 983 is connected to carry the signal from the substrate of transistor N6 to matchline ML (not specifically shown in this drawing); segment 994 also carries the signal from the substrate of transistor N8 to matchline ML. Segments 984, 993 receive the voltage of Vss 917 through vias 962, 978 and carry this voltage to the substrate at contacts 932, 964 and 976, 938 respectively. Segments 985, 992 receive the signal of wordline WL 913 through vias 944A, 948A and carry this voltage to the gates of transistors N1, N3 through contacts 944, 948. Segments 986, 991 receive the respective signals of BL 903 and /BL 909 through vias 934A, 936A and carry this signal to the substrate at contacts 934, 936. Segment 987 is an internal node corresponding to point 206 in FIG. 2 and ties together contacts 946, 950, 952, while segment 989 is another internal node corresponding to point 208 in FIG. 2 and tying together contacts 954, 956, 972. Finally, segments 988, 990 are connected to Vdd 905, 907 through vias 970A, 974A and carry this voltage to the substrate at contacts 970, 974.

The layout of FIGS. 9A, 9B does have the advantage of achieving an aggressive cell size (2.89 sq um) and realizing many of the advantages over the conventional cell that are listed for the ternary CAM cell. However, it also has several disadvantages:

a) The cell dimension in the horizontal direction (in the figures) is very large compared to that in the vertical direction. This implies that the RC delays associated with the wordlines and hitlines are unduly large.

b) The vertical dimension is very short. While this is beneficial from the point of view of bitline delay, it leaves no room for a global hitline (this would consume much more space—in this case, push the cell size to >4 sq um). Furthermore, the design of the peripheral logic structures such as row decoders becomes problematic.

For these reasons, the earlier BCAM layout is preferred over this design.

In general, the ternary and binary CAM cell layouts in accordance with the present invention offer the following advantages:

a) Compactness. For example, the ternary CAM cell described herein and illustrated in FIGS. 7A and 7B is 4.33 sq um in area in the 90 nm node. By comparison, the smallest ternary CAM cell that has been reported is over 4.5 sq um in area.

b) "Process-friendly" layout architectures. The specific details of the layouts that make them process-friendly are described above. These features include all transistors being formed in the same direction, no enclosed "donut' shaped" diffusion areas, and complete symmetry within the appropriate pairs of bit lines and word lines.

c) The presence of a split wordline. This feature allows for writing to half the ternary CAM cell at a time, thus reducing peak power requirements.

d) Different threshold voltages are possible for N-type transistors within each bitcell layout.

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

What is claimed is:

1. A content addressable memory (CAM) cell, comprising:
   a first static random-access memory (SRAM) bitcell comprising two p-type transistors and four n-type transistors, said first SRAM bitcell being connected to a wordline, a source voltage, a drain voltage, and a first pair of complementary bitlines, such that a first bit can be stored in said first SRAM bitcell, wherein the layout of the first SRAM bitcell is asymmetric; and
   a first comparison circuit and a second comparison circuit, each comprising two n-type transistors, wherein said first comparison circuit and said second comparison circuit are connected to compare the value of said CAM cell to a value carried by a first and a second hitline;
   wherein the layout of said first SRAM bitcell and the layout of a second SRAM bitcell that shares a side with said first SRAM bitcell are 180 degree rotations of each other within the plane of the layout such that said first pair of complementary bitlines traverse identical surface structures and have equal capacitance loading.

2. The content addressable memory cell of claim 1, wherein all of said n-type and p-type transistors are oriented in a single direction.

3. The content addressable memory cell of claim 1, wherein polysilicon lines that form the gates of adjacent ones of said p-type and n-type transistors are straight and contain no jogs.

4. The content addressable memory cell of claim 1, further comprising a continuous Nwell.

5. The content addressable memory cell of claim 1, wherein said n-type transistors of said first comparison circuit and said n-type transistors of said second comparison circuit have a first threshold voltage and said n-type transistors of said first SRAM bitcell have a second threshold voltage that is different from said first threshold voltage.

6. The content addressable memory cell of claim 1,
   wherein the cell is a binary CAM cell;
   wherein said first comparison circuit and said second comparison circuit are each electrically connected to said first SRAM bitcell and said second SRAM bitcell is part of an adjacent binary CAM cell.

7. The content addressable memory cell of claim 6 wherein said wordline is a split wordline.

8. The content addressable memory cell of claim 1,
   wherein said second static random-access memory (SRAM) bitcell comprises two p-type transistors and four n-type transistors, said second SRAM bitcell being connected to said wordline, said source voltage, said drain voltage, and a second pair of complementary bitlines, such that a second bit can be stored in said second SRAM bitcell;
   wherein said first comparison circuit is electrically connected to said first SRAM bitcell and said second comparison circuit is electrically connected to said second SRAM bitcell;
   wherein the cell is a ternary CAM cell.

9. The content addressable memory cell of claim 8, wherein said n-type transistors of said first comparison circuit and said n-type transistors of said second circuit share a continuous straight-edged n-type diffusion region.

10. The content addressable memory cell of claim 1, wherein diffusion regions for said n-type transistors of said first SRAM bitcell, said first comparison circuit, and said second comparison circuit do nor enclose any isolation regions.

11. The content addressable memory cell of claim 1, wherein said CAM cell contains only three metallization layers.

12. A ternary content addressable memory (TCAM) array, comprising:
    a plurality of TCAM cells arranged in rows and columns, each TCAM cell having
       a first static random-access memory (SRAM) bitcell comprising two p-type transistors and four n-type transistors, said first SRAM bitcell being connected to a wordline, a source voltage, a drain voltage, and a respective first pair of complementary bitlines, such that a first bit can be stored in said first SRAM bitcell;
       a first comparison circuit and a second comparison circuit, each comprising two n-type transistors, wherein said first comparison circuit and said second comparison circuit are connected to compare the value of said TCAM cell to a value carried by a respective first and a respective second hitline; and
       a second static random-access memory (SRAM) bitcell comprising two p-type transistors and four n-type transistors, said second SRAM bitcell being connected to said wordline, said source voltage, said drain voltage, and a second respective pair of complementary bitlines, such that a second bit can be stored in said second SRAM bitcell;
       wherein said first comparison circuit is electrically connected to said first SRAM bitcell and said second comparison circuit is electrically connected to said second SRAM bitcell;
       wherein the layout of each TCAM cell is asymmetric;
    wherein the layout of a first TCAM bitcell in said TCAM array is a rotation of 180 degrees within the plane of the layout from a second TCAM bitcell that shares an edge with the first TCAM bitcell.

13. The content addressable memory array of claim 12, wherein said wordline comprises a first wordline connected to said first SRAM bitcell in each TCAM cell and a second wordline connected to said second SRAM bitcell in each TCAM cell and the capacitive loading of said first wordline and said second wordline are equal.

14. The content addressable memory array of claim 12, wherein said array contains a continuous N-well.

15. The content addressable memory array of claim 12, wherein said array contains a global hitline.

16. The content addressable memory array of claim 12, wherein each of said respective bitline pairs in said array have equal capacitive loading on both lines in said bitline pair.

* * * * *